US012729948B2

(12) United States Patent
Jansen et al.

(10) Patent No.: US 12,729,948 B2
(45) Date of Patent: Sep. 8, 2026

(54) METHOD TO DETERMINE AN ABSOLUTE POSITION OF A MOVABLE OBJECT, INTERFEROMETER SYSTEM, PROJECTION SYSTEM AND LITHOGRAPIC APPARATUS

(71) Applicant: ASML Netherlands B.V., Veldhoven (NL)

(72) Inventors: Maarten Jozef Jansen, Hoogeloon (NL); Willem Herman Gertruda Anna Koenen, Roermond (NL)

(73) Assignee: ASML Netherlands B.V., Veldhoven (NL)

( * ) Notice: Subject to any disclaimer, the term of this patent is extended or adjusted under 35 U.S.C. 154(b) by 59 days.

(21) Appl. No.: 18/870,341

(22) PCT Filed: May 25, 2023

(86) PCT No.: PCT/EP2023/064096
§ 371 (c)(1),
(2) Date: Nov. 27, 2024

(87) PCT Pub. No.: WO2024/002595
PCT Pub. Date: Jan. 4, 2024

(65) Prior Publication Data

US 2025/0327653 A1 Oct. 23, 2025

(30) Foreign Application Priority Data

Jun. 30, 2022 (EP) .................................... 22182093

(51) Int. Cl.
*G01B 9/02001* (2022.01)
*G01B 11/00* (2006.01)
*G03F 7/00* (2006.01)

(52) U.S. Cl.
CPC ........ *G01B 9/02007* (2013.01); *G01B 11/002* (2013.01); *G03F 7/70408* (2013.01)

(58) Field of Classification Search
CPC .............. G01B 9/02007; G01B 11/002; G01B 9/02016; G01B 9/02027; G01B 9/02078; G01B 9/02002; G03F 7/70408
See application file for complete search history.

(56) References Cited

U.S. PATENT DOCUMENTS

2011/0211198 A1* 9/2011 Koda ................ G01B 9/02027 356/499
2013/0148129 A1 6/2013 Warden et al.
2021/0072088 A1 3/2021 Van Der Pasch et al.

FOREIGN PATENT DOCUMENTS

WO WO 2019/149515 A1 8/2019
WO WO 2021/094207 A1 5/2021
WO WO 2021/213750 A1 10/2021

OTHER PUBLICATIONS

International Search Report and Written Opinion of the International Searching Authority directed to International Patent Application No. PCT/EP2023/064096, mailed Aug. 30, 2023; 10 pages.

(Continued)

*Primary Examiner* — Tony Ko

(74) *Attorney, Agent, or Firm* — FINNEGAN, HENDERSON, FARABOW, GARRETT & DUNNER, LLP

(57) ABSTRACT

A method to determine an absolute position of a first movable object using an interferometer system is described, said method comprising: providing first and second beams with a first light frequency from a first light source; providing further first and further second beams with a second (tunable) light frequency from a second light source; guiding the first and further first beams along a first axis to a reflective surface of the first object to obtain a first interferometer signal and guiding the second and further second beams along a second axis to a reflective surface of a second object to obtain a second interferometer signal, while chang- (Continued)

ing the tunable frequency, detecting the first and further first interferometer signals, detecting the second and further second interferometer signals, determining a first count offset and/or a further first count offset using a non-linear equation, and determining the absolute position of the first object.

20 Claims, 3 Drawing Sheets

(56) References Cited

OTHER PUBLICATIONS

Dale et al., "Multi-channel absolute distance measurement system with sub ppm-accuracy and 20 m range using frequency scanning interferometry and gas absorption cells," Optics Express, vol. 22, No. 20, Oct. 3, 2014; pp. 24869-24893.

* cited by examiner

METHOD TO DETERMINE AN ABSOLUTE POSITION OF A MOVABLE OBJECT, INTERFEROMETER SYSTEM, PROJECTION SYSTEM AND LITHOGRAPIC APPARATUS

CROSS-REFERENCE TO RELATED APPLICATION

The application claims priority of EP Application Serial No. 22182093.9 which was filed on 30 Jun. 2022 and which is incorporated herein in its entirety by reference.

FIELD OF THE INVENTION

The present invention relates to a method to determine an absolute position of a movable object using an interferometer system. The invention further relates to an interferometer system and to a projection system for optical lithography systems and/or a lithographic apparatus comprising such interferometer system.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In embodiments of a lithographic apparatus, interferometer systems are used to determine the position of movable objects with high accuracy. Examples of these movable objects are the substrate support and movable optic elements, for example mirrors of the projection optics box.

A drawback of most known interferometers is that an interferometer is only able to determine relative displacements of the movable object with respect to a reference location. In order to determine an absolute position of the movable object with respect to the reference location a separate zeroing sensor may be provided. This zeroing sensor is used to determine an absolute starting position of the movable object. Once this absolute starting position is known, the interferometer may determine a relative displacement of the movable object with respect to this absolute starting position in order to calculate an absolute position of the movable object.

The zeroing sensor is normally mounted at a specific location at which the absolute starting position of the movable object may be determined. The absolute position of the movable object may therefore only be determined when the movable object is within a relatively small measurement range of the zeroing sensor. The measurement range of the zeroing sensor is typically close to the zeroing sensor, for example within a few centimeters of the zeroing sensor. Each time the measurement of the movable object is started using the interferometer, the movable target has to be brought back into the relatively small measurement range of the zeroing sensor of the position measurement system. This may not only be the case when the lithographic apparatus is started, but for example also when the movable object is shortly out of view of the interferometer, for example when passing behind another movable object.

WO2019149515A1 discloses a method to determine an absolute position of a movable object with respect to a reference object using an interferometer system. The interferometer system comprises a measurement axis including a reflective measurement surface on the object and a reference axis including a reflective reference surface on the reference object. In this method a first beam and a second beam originating from a first light source are guided through the measurement axis and the reference axis, respectively. Similarly, a further first beam and a further second beam originating from a second light source are guided through the measurement axis and the reference axis, respectively. The light frequency of the second light source is tunable so that the light frequency of the second light source can be changed during the measurements.

WO2019149515A1 provides an algorithm in which specific measurements values of the interferometer signals obtained from the measurements in the measurement axis and the reference axis are selected to determine the absolute position of the movable object. This algorithm requires that the length of the reference axis is stable, i.e. does not change during measurements. Moreover, the calculations are relatively complex and may require some specific selection criteria for the measurement data which may complicate the application of the method.

In another known method to determine the absolute position of the movable object, it is required that the tuning frequency of the tunable light source is high in order to make the measurements less sensitive to movement of the movable object.

Although both methods are capable of determining an absolute position of a movable object with an interferometer system, the requirements of a stable length reference axis and/or a fast frequency modulating light source in combination with relative complex calculations, limit the practical application of these methods in an interferometer system.

SUMMARY OF THE INVENTION

It is an object of the invention to provide an improved method to determine an absolute position of a movable object using an interferometer system. In particular, it is an object of the invention to provide a method to determine an absolute position of a movable object using an interferometer which does not require a fast frequency modulating light source and/or a fixed reference axis. It is a further object to provide an interferometer system in which such method may be implemented.

According to an aspect of the invention, there is provided a method to determine an absolute position of a first movable object using an interferometer system, said method comprising:

providing a first beam and a second beam with a first light frequency from a first light source;

providing a further first beam and a further second beam with a second light frequency from a second light source, wherein the second light frequency is a tunable light frequency;

guiding the first beam and the further first beam along a first measurement axis to a first reflective surface of the first movable object to obtain a first interferometer signal and a further first interferometer signal, respectively, guiding the second beam and the further second beam along a second measurement axis to a second reflective surface of a second object to obtain a second interferometer signal and a further second interferometer signal, respectively, while changing the tunable light frequency of the second light source, detecting at at least one first detector the first interferometer signal and the further first interferometer signal, detecting at at least one second detector the second interferometer signal and the further second interferometer signal, determining on the basis of the first interferometer signal, the further first interferometer signal, the second interferometer signal and the further second interferometer signal a first count offset and/or a further first count offset using a non-linear equation, wherein the non-linear equation is based on the relationship:

$$\lambda_{ls2}/\lambda_{ls1} = C_{ma1,ls1}/C_{ma1,ls2} = C_{ma2,ls1}/C_{ma2,ls2},$$

wherein $\lambda_{ls2}$ is the second wavelength of the second light source, $\lambda_{ls1}$ is the first wavelength of the first light source, $C_{ma1,ls1}$ is a total number of counts with respect to the first measurement axis and the first beam, $C_{ma1,ls2}$ is a total number of counts with respect to the first measurement axis and the further first beam, $C_{ma2,ls1}$ is a total number of counts with respect to the second measurement axis and the second beam, $C_{ma2,ls2}$ is a total number of counts with respect to the second measurement axis and the further second beam, and determining the absolute position of the first movable object on the basis of the first count offset and the first interferometer signal or on the basis of the further first count offset and the further first interferometer signal.

According to an aspect of the invention, there is provided an interferometer system to determine an absolute position of a first movable object, said interferometer system comprising:

a first light source arranged to provide a first beam and a second beam with a first light frequency;

a second light source arranged to provide a further first beam and a further second beam with a second light frequency, wherein the second light source is arranged to provide a tunable second light frequency, a first measurement axis for guiding the first beam and the further first beam to a first reflective surface of the first movable object to obtain a first interferometer signal and a further first interferometer signal, respectively, a second measurement axis for guiding the second beam and the further second beam to a second reflective surface of a second object to obtain a second interferometer signal and a further second interferometer signal, respectively, at least one first detector to detect the first interferometer signal and the further first interferometer signal, at least one second detector to detect the second interferometer signal and the further second interferometer signal, a processing device, wherein the processing device is arranged to:

determine on the basis of the first interferometer signal, the further first interferometer signal, the second interferometer signal and the further second interferometer signal a first count offset and/or a further first count offset using a non-linear equation, wherein the non-linear equation is based on the relationship:

$$\lambda_{ls2}/\lambda_{ls1} = C_{ma1,ls1}/C_{ma1,ls2} = C_{ma2,ls1}/C_{ma2,ls2},$$

wherein $\lambda_{ls2}$ is the second wavelength of the second light source, $\lambda_{ls1}$ is the first wavelength of the first light source, $C_{ma1,ls1}$ is a total number of counts with respect to the first measurement axis and the first beam, $C_{ma2,ls2}$ is a total number of counts with respect to the first measurement axis and the further first beam, $C_{ma2,ls1}$ is a total number of counts with respect to the second measurement axis and the second beam, $C_{ma2,ls2}$ is a total number of counts with respect to the second measurement axis and the further second beam, and determine the absolute position of the first movable object on the basis of the first count offset and the first interferometer signal or on the basis of the further first count offset and the further first interferometer signal.

According to an aspect of the invention, there is provided a projection system for optical lithography systems and/or a lithographic apparatus comprising such an interferometer system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
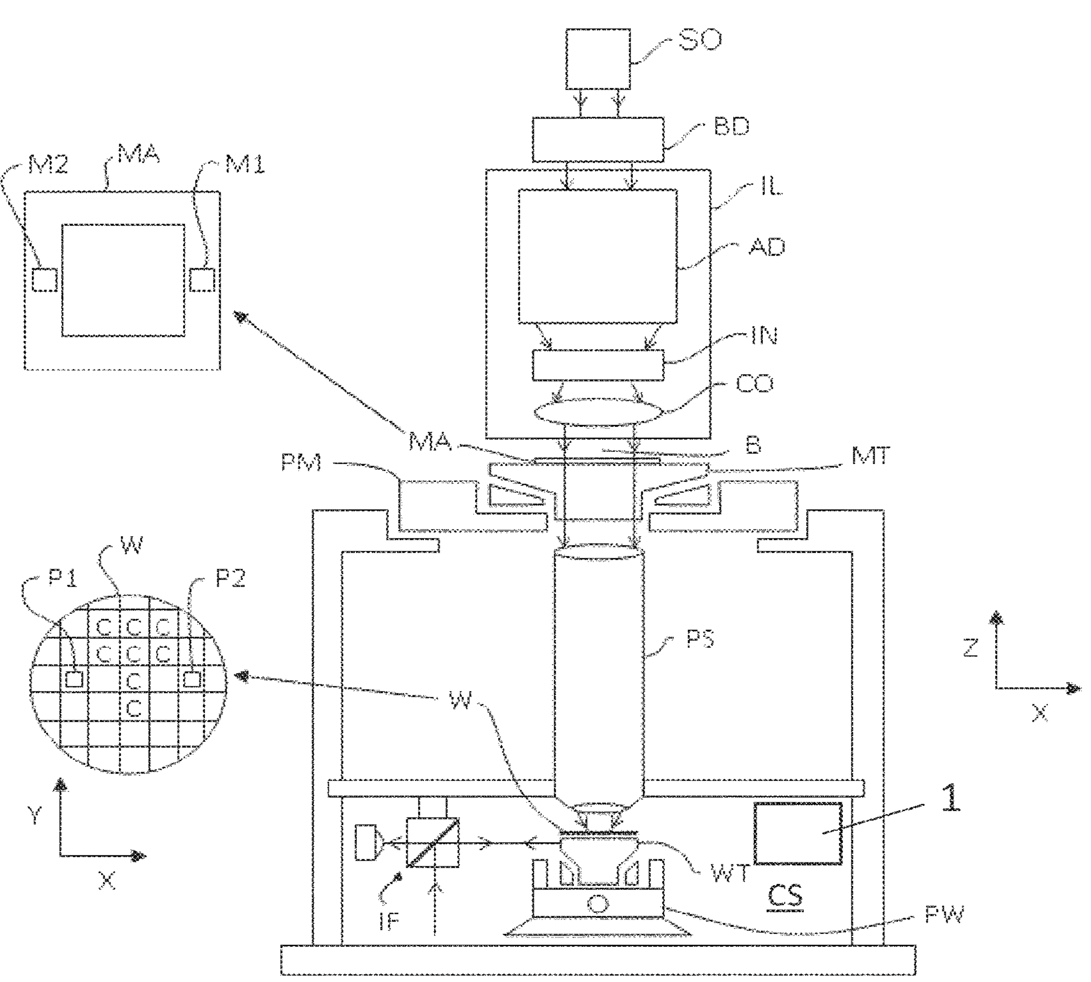
FIG. 1 depicts schematically a lithographic apparatus.

FIG. 1 schematically depicts a lithographic apparatus according to one embodiment of the invention. The apparatus comprises an illumination system IL, a support structure MT, a substrate table WT and a projection system PS.

The illumination system IL is configured to condition a radiation beam B. The support structure MT (e.g. a mask table) is constructed to support a patterning device MA (e.g. a mask) and connected to a first positioner PM configured to accurately position the patterning device in accordance with certain parameters. The substrate table WT (e.g. a wafer table) is constructed to hold a substrate W (e.g. a resist-coated wafer) W and connected to a second positioner PW configured to accurately position the substrate in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam B in different directions. The tilted mirrors impart a pattern in a radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables WT (and/or two or more mask tables). In such "multiple stage" machines the additional tables may be used in parallel, or preparatory steps may be carried out on one or more tables while one or more other tables are being used for exposure. In addition to one or more substrate tables WT, the lithographic apparatus may have a measurement stage that is arranged to be at a position beneath the projection system PS when the substrate table WT is away from that position. Instead of supporting a substrate W, the measurement stage may be provided with sensors to measure properties of the lithographic apparatus. For example, the projection system may project an image on a sensor on the measurement stage to determine an image quality.

The lithographic apparatus may also be of a type wherein at least a portion of the substrate W may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illumination system IL receives a radiation beam B from a radiation source SO. The radiation source SO and the lithographic apparatus may be separate entities, for example when the radiation source SO is an excimer laser. In such cases, the source is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illumination system IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator IN and a condenser CO. The illumination system IL may be used to condition the radiation beam B, to have a desired uniformity and intensity distribution in its cross-section.

The radiation beam B is incident on the patterning device MT, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan.

In general, movement of the support structure MT may be realized with the aid of a long-stroke module and a short-stroke module, which form part of the first positioner PM. The long-stroke module may provide coarse positioning of the short-stroke module over a large range of movement. The short-stroke module may provide fine positioning of the support structure MT relative to the long-stroke module over a small range of movement. Similarly, movement of the substrate table WT may be realized using a long-stroke module and a short-stroke module, which form part of the second positioner PW. The long-stroke module may provide coarse positioning of the short-stroke module over a large range of movement. The short-stroke module may provide fine positioning of the substrate table WT relative to the long-stroke module over a small range of movement. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the mask alignment marks M1, M2 may be located between the dies.

The depicted apparatus could be used in at least one of the following modes:

In a first mode, the so-called step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the so-called scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a third mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
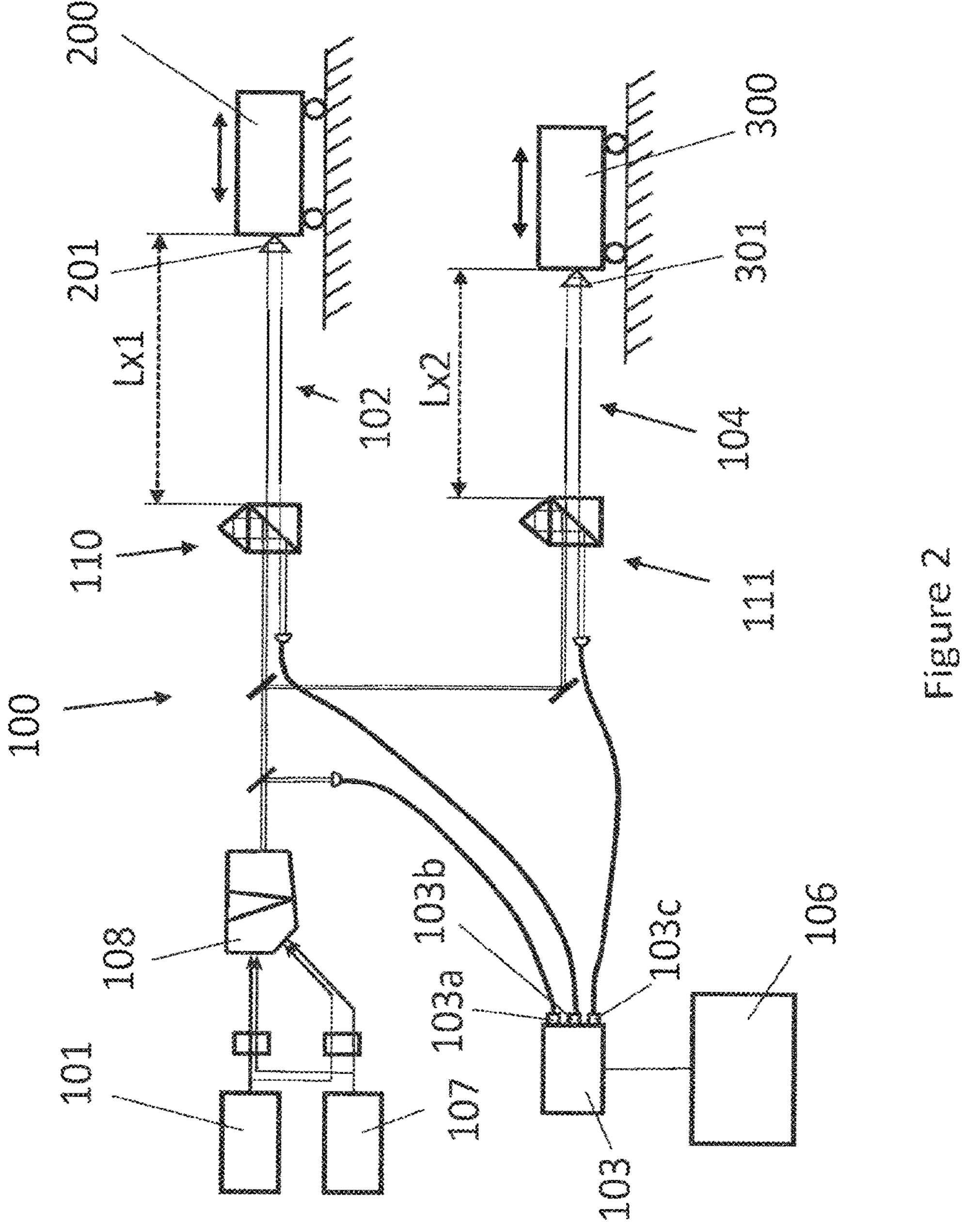
FIG. 2 shows a first embodiment of an interferometer system according to the invention.

FIG. 2 shows an embodiment of an interferometer system 100 according to the invention. The interferometer system 100 is arranged to determine an absolute position of a first movable object 200 and an absolute position of a second movable object 300. The interferometer system 100 may be a single or multipass interferometer system.

The first movable object 200 and the second movable object 300 are for example parts, e.g. mirrors, of a projection system PS and/or the movable substrate support WT of a lithographic apparatus. The first movable object 200 comprises a first reflective measurement surface 201 and the second movable object 300 comprises a second reflective measurement surface 301.

The interferometer system 100 is a heterodyne interferometer system comprising a first light source 101 to provide a light beam, for example a laser beam with a fixed first light frequency. The first light source 101 is for example a stabilized HeNe laser source. The light beam of the first light source 101 is split, for example by a non-polarizing beam splitter, into a first beam and a second beam. The first beam is directed to interferometer optics 110 of a first measurement axis 102. The interferometer optics 110 are arranged to split the first beam into a first measurement beam and a first reference beam. The first measurement beam is guided along a measurement path, having a measurement path length $L_{x1}$, to the first reflective measurement surface 201 on the first movable object 200. After the first measurement beam is reflected by the first reflective measurement surface 201, the first measurement beam is recombined with the first reference beam in the interferometer optics 110 to form a first interferometer signal. The first interferometer signal is directed to a detector 103*b* which is connected to a light sensor device 103.

The second beam of the laser beam is directed to interferometer optics 111 of a second measurement axis 104. The interferometer optics 111 is arranged to split the second beam into a second measurement beam and a second reference beam. The second beam measurement is guided along a second measurement path, having a measurement path length $L_{x2}$, to the second reflective measurement surface 301. After the second measurement beam is reflected by the second reflective measurement surface 301, the second measurement beam is recombined with the second reference beam in the interferometer optics 111 to form a second interferometer signal. The second interferometer signal is directed to a detector 103*c* which is connected to the light sensor device 103. A part of the light beam of the first light source 101 is directed to a detector 103*a* which is connected to the light sensor device 103. This part of the light beam will not be guided into the first measurement axis 102 or the second measurement axis 104.

The detector 103*a* propagates the part of the light beam onto a light diode of the light sensor device 103. The detector 103*b* propagates the recombined first beam and first reference beam onto another light diode of the light sensor device 103. The detector 103*c* propagates the recombined second beam and second reference beam onto yet another light diode of light sensor device 103. The measurements of the light diodes are fed via the light sensor device 103 into a processing device 106. The processing device 106 generates a first measurement phase value $ph_{ma1,\ ls1}$ based on the input of the first interferometer signal at the detector 103*b*. Alternatively, the processing device 106 may generate the first measurement phase value $ph_{ma1,\ ls1}$ based on the input by the detector 103*b* and the input by the detector 103*a* to compensate for disturbances of the laser beam between the first light source 101 and the interferometer optics 110. The processing device 106 generates a second measurement phase value $ph_{ma2,\ ls1}$ based on the input of the second interferometer signal at the detector 103*c*. Alternatively, the processing device 106 may generate the first reference phase value $ph_{ma2,\ ls1}$ based on the input by the detector 103*c* and the input by the detector 103*a* to compensate for disturbances of the laser beam between the first light source 101 and the interferometer optics 111. The first measurement phase value $ph_{ma1,\ ls1}$ is related to a distance or displacement of the measurement object 200, i.e., the first measurement path length $L_{x1}$. The second measurement phase value $ph_{ma2,\ ls1}$ is related to the second measurement path length $L_{x2}$.

The interferometer system 100 comprises a second light source 107. The second light source 107 has a tunable light frequency. In the shown embodiment, the second light source 107 is configured to provide a second laser beam with a tunable light frequency, for example from a tunable laser source. The second laser beam is split in a further first beam and a further second beam. Similar to the first beam, the further first beam is directed to interferometer optics 110 of the first measurement axis 102. The interferometer optics 110 are arranged to split the further first beam into a further first measurement beam and a further first reference beam. The further first measurement beam is guided along a measurement path, having the measurement path length $L_{x1}$, to the first reflective measurement surface 201 on the first movable object 200. After the further first measurement beam is reflected by the first reflective measurement surface 201, the further first measurement beam is recombined with the further first reference beam in the interferometer optics 110 to form a further first interferometer signal. The further first interferometer signal is directed to the detector 103*b* which is connected to the light sensor device 103.

The further second beam is directed to interferometer optics 111 of the second measurement axis 104. The interferometer optics 111 are arranged to split the further second beam into a further second measurement beam and a further second reference beam. The further second measurement beam is guided along the second measurement path, having the second measurement path length $L_{x2}$, to the second reflective measurement surface 301. After the further second measurement beam is reflected by the second reflective measurement surface 301, the further second measurement beam is recombined with the further second reference beam in the interferometer optics 111 to form a further second interferometer signal. The further second interferometer signal is directed to the detector 103*c* which is connected to the light sensor device 103.

A part of the second light beam of the second light source 107 is directed to the detector 103*a* which is connected to the light sensor device 103. This part of the second light beam has not interacted with the first reflective measurement surface 201 or the second reflective measurement surface 301.

The detector 103*a* propagates the part of the second light beam onto a light diode of the light sensor device 103. The detector 103*b* propagates the recombined further first beam and further first reference beam onto another light diode of the light sensor device 103. The detector 103*c* propagates the recombined further second beam and further second reference beam onto yet another light diode of light sensor device 103. The measurements of the light diodes are fed via the light sensor device 103 into the processing device 106. The processing device 106 generates a further first measurement phase value $ph_{ma1,\ ls2}$ based on the input of the further first interferometer signal at the detector 103*b*. Alternatively, the processing device 106 may generate the further first measurement phase value $ph_{ma1,\ ls2}$ based on the input by the detector 103*b* and the input by the detector 103*a* to compensate for disturbances of the second laser beam between the second light source 107 and the interferometer optics 110. The processing device 106 generates a further second phase value $ph_{ma2,\ ls2}$ based on the input of the further second interferometer signal at the detector 103*c*. Alternatively, the processing device 106 may generate the further second measurement phase value $ph_{ma2,\ ls2}$ based on the input by the detector 103*c* and the input by the detector 103*a* to compensate for disturbances of the second laser beam between the second light source 107 and the interferometer optics 111. The further first measurement phase value $ph_{ma1,\ ls2}$ is related to a distance or displacement of the first movable object 200, i.e., the first measurement path length $L_{x1}$. The further second measurement phase value $ph_{ma2,\ ls2}$ is related to a distance or displacement of the second movable object 300, i.e., the second measurement path length $L_{x2}$.

Thus, the light beams of the first light source 101 and the second light source 107 follow the same paths in the first measurement axis 102 and the second measurement axis 104 after being combined in a Rochon prism 108 as shown in FIG. 2. In an embodiment, an optical component other than a Rochon prism 108 may also be used to combine the light beams of the first light source 101 and the second light source 107.

In the shown embodiment, the first interferometer signal and the further first interferometer signal are both guided to the detector 103*b* and the second interferometer signal and the second interferometer signal are both guided to the detector 103*c*. In an alternative embodiment, the first interferometer signal and the further first interferometer signal may be guided to two separate detectors after optical separation of the first interferometer signal and the further first interferometer signal. Correspondingly, the second interferometer signal and the further second interferometer signal may be guided to two separate detectors after optical separation of the second interferometer signal and the further second interferometer signal.

The processing device 106 is arranged to distinguish the first measurement phase value $ph_{ma1,\ ls1}$, the second measurement phase value $ph_{ma2,\ ls1}$, the further first measurement phase value $ph_{ma1,\ ls2}$, and the further second measurement phase value $ph_{ma2,\ ls2}$.

The first measurement phase value $ph_{ma1,\ ls1}$ and the further first measurement phase value $ph_{ma1,\ ls2}$ may change due to movements of the first movable object 200. The second measurement phase value $ph_{ma2,\ ls1}$ and the further second measurement phase value $ph_{ma2,\ ls2}$ may change due to movements of the second movable object 300.

Further, the first measurement phase value $ph_{ma1,\ ls1}$ and the second measurement phase value $ph_{ma2,\ ls1}$ may change due to a change in the first light frequency of the first light source 101. The further first measurement phase value $ph_{ma1,\ ls2}$ and the further second measurement phase value $ph_{ma2,\ ls2}$ may change due to a change in the second light frequency of the second light source 107.

Due to these changes the first measurement phase value $ph_{ma1,\ ls1}$, the second measurement phase value $ph_{ma2,\ ls1}$, the further first measurement phase value $ph_{ma1,\ ls2}$, and the further second measurement phase value $ph_{ma2,\ ls2}$ may follow within a spatial period, i.e. wavelength, of the light frequency of the respective light source a periodic profile. When the respective measurement phase value runs from one period to another period, this can be determined by the processing device 106 and is defined as a count. By adding the counts (which may be positive or negative in dependence of the direction of movement of the respective movable object or change in light frequency of the respective light source), the change in position and/or change in light frequency during measurement may be registered as a number of counts. For example, $\Delta C_{ma1,\ ls1}(t)$ is a change in counts over time with respect to the first measurement axis 102 and the first beam measured with the first interferometer signal, e.g. the first measurement phase value $ph_{ma1,\ ls1}$.

The absolute position L1 of the first movable object 200 as measured by the first beam may be described as:

$$L_{ma1,1s1} = \lambda_{1s1} * C_{ma1,1s1},$$

wherein $\lambda_{ls1}$ is the first wavelength of the first light source and $C_{ma1,\ ls1}$ is a total number of counts with respect to the first measurement axis 102 and the first beam, i.e. light originating from the first light source 101.

It is noted that on the basis of the first measurement phase value $ph_{ma1,\ ls1}$, a relative position of the first movable object 200 within the wavelength, i.e. spatial period, may also be determined. This relative position may be added to the number of counts $C_{ma1,\ ls1}$, e.g. as a real number between 0 and 1 to improve the accuracy of determining the absolute position of the first movable object 200, e.g. by interpolation.

The absolute position L1 of the first movable object 200 using measurements with the further first beam may be described as:

$$L_{ma1,1s2} = \lambda_{1s2} * C_{ma1,1s2},$$

wherein $\lambda_{ls2}$ is the second wavelength of the second light source and $C_{ma2,\ ls2}$ is a total number of counts with respect to the first measurement axis and the further first beam. The further first measurement phase value $ph_{ma1,\ ls2}$, may also be used to determine a relative position of the first movable object 200 within the wavelength (spatial period).

The absolute position L2 of the second movable object 300 using measurements with the second beam and the further second beam may be described as:

$$L_{ma2,1s1} = \lambda_{1s1} * C_{ma2,1s1}, \text{ and}$$

$$L_{ma2,1s2} = \lambda_{1s2} * C_{ma2,1s2} \text{ respectively,}$$

wherein $C_{ma2,\ ls1}$ is a total number of counts with respect to the second measurement axis and the second beam, and $C_{ma2,\ ls2}$ is a total number of counts with respect to the second measurement axis and the further second beam. Also here it is noted that the second measurement phase value $ph_{ma2,\ ls1}$ and the further second measurement phase value $ph_{ma2,\ ls2}$ may also be used to determine a relative position of the second movable object 200 within a wavelength (spatial period).

When the start position of the first movable object 200 is not known, the total number of counts $C_{ma1,\ ls1}$ is also not known. The total number of counts $C_{ma1,\ ls1}$ may be described as $$C_{ma1,1s1}(t) = \Delta C_{ma1,1s1}(t) + \text{offset}_{ma1,1s1}$$

Herein, the total number of counts $C_{ma1,\ ls1}$ with respect to the first beam in the first measurement axis 102 is defined as a not-known first count offset $\text{offset}_{ma1,\ ls1}$ plus the measured change $\Delta C_{ma1,\ ls1}(t)$ in counts.

Similarly, the total number of counts $C_{ma1,\ ls2}(t)$, $C_{ma2,\ ls1}(t)$ and $C_{ma2,\ ls2}(t)$ may be described as:

$$C_{ma1,1s2}(t) = \Delta C_{ma1,1s2}(t) + \text{offset}_{ma1,1s2}$$

$$C_{ma2,1s1}(t) = \Delta C_{ma2,1s1}(t) + \text{offset}_{ma2,1s1}$$

$$C_{ma2,1s2}(t) = \Delta C_{ma2,1s2}(t) + \text{offset}_{ma2,1s2}$$

wherein $\text{offset}_{ma1,\ ls2}$ is the further first offset of the counts with the further first beam in the first measurement axis 102, $\text{offset}_{ma2,\ ls1}$ is the second offset of the counts with the second beam in the second measurement axis, and $\text{offset}_{ma2,\ ls2}$ is the further second offset of the counts with the further second beam in the second measurement axis For the counts of the first light source 101 and the second light source 107 to be consistent the following equations apply:

$$L_{ma1,1s1}(t) = \lambda_{1s1}(t) * C_{ma1,1s1}(t) = L_{ma1,1s2}(t) = \lambda_{1s2}(t) * C_{ma1,1s2}(t)$$

$$L_{ma2,1s1}(t) = \lambda_{1s1}(t) * C_{ma2,1s1}(t) = L_{ma2,1s2}(t) = \lambda_{1s2}(t) * C_{ma2,1s2}(t),$$

wherein:

$L_{ma1,\ ls1}(t)$ is a first position determined in the first measurement axis with the first beam, $\lambda_{ls1}$ is the first wavelength of the first light source, $C_{ma1,\ ls1}$ is a total number of counts with respect to the first measurement axis and the first beam, $L_{ma1,\ ls2}(t)$ is the first position determined in the first measurement axis with the further first beam, $\lambda_{ls2}$ is the second wavelength of the second light source, $C_{ma1,\ ls2}$ is a total number of counts with respect to the first measurement axis and the further first beam, $L_{ma2,\ ls1}(t)$ is a second position determined in the second measurement axis with the second beam and $C_{ma2,\ ls1}$ is a total number of counts with respect to the second measurement axis and the second beam, $L_{ma2,\ lst}(t)$ is the second position determined in the second measurement axis with the further second beam and $C_{ma2,\ ls2}$ is a total number of counts with respect to the second measurement axis and the further second beam.

This leads to:

$$\lambda_{1s2}(t)/\lambda_{1s1}(t) = C_{ma1,1s1}(t)/C_{ma1,1s2}(t), \text{ and}$$

$$\lambda_{1s2}(t)/\lambda_{1s1}(t) = C_{ma2,1s1}(t)/C_{ma2,1s2}(t).$$

and therefore:

$$\lambda_{1s2}(t)/\lambda_{1s1}(t) = C_{ma1,1s1}(t)/C_{ma1,1s2}(t) = C_{ma2,1s1}(t)/C_{ma2,1s2}(t),$$

By using the relationship between these ratios, a non-linear equation can be defined on the basis of which the absolute position of the first movable object 200 and/or the second movable object 300 may be determined. This non-linear equation is for example:

$$C_{ma1,1s2}(t)*C_{ma2,1s1}(t)=C_{ma2,1s2}(t)*C_{ma1,1s1}(t).$$

An advantage of this non-linear equation is that the equation does not require a stabilized first light frequency of the first light source 101. Also, it is not required that one of the objects 200, 300 is a static object that remains in a fixed static position.

Since the total number of counts for measurement axis i and light source j can be described as:

$$C_{mai,lsj}(t)=\Delta C_{mai,lsj}(t)+\text{offset}_{mai,lsj}$$

the non-linear equation may also be described as:

$$(\Delta C_{ma1,1s2}(t)+\text{offset}_{ma1,1s2})*(\Delta C_{ma2,1s1}(t)+\text{offset}_{ma2,1s1})=(\Delta C_{ma2,1s2}(t)+\text{offset}_{ma2,1s2})*(\Delta C_{ma1,1s1}(t)+\text{offset}_{ma1,1s1})$$

The processing device 106 of the interferometer system 100 is arranged to use this non-linear equation to calculate the first count offset $\text{offset}_{ma1,\ ls1}$ and/or the further first count offset $\text{offset}_{ma1,\ ls2}$. The processing device 106 will solve the equation in order to find solutions for the four unknown parameters $\text{offset}_{ma1,\ ls1}$, $\text{offset}_{ma1,\ ls2}$, $\text{offset}_{ma2,\ ls1}$ and $\text{offset}_{ma2,\ ls2}$. Once the first count offset $\text{offset}_{ma1,\ ls1}$ and/or the further first count offset $\text{offset}_{ma1,\ ls2}$ is known the absolute position of the first movable object 200 can be calculated.

Finding the solution of the non-linear equation may comprise obtaining a first estimate of the solution using a reduced dataset and using the first estimate as input for solving the non-linear equation for a complete dataset.

For the non-linear equation with four unknown parameters, i.e. the four count offsets, to become solvable with high accuracy it is required that the frequency difference between the first light frequency and the second light frequency is not constant, i.e. at least one of the first light source 101 and the second light source 107 needs to have a changing first light frequency or changing second light frequency, respectively. Furthermore, the length ratio $L_{ma1}/L_{ma2}$ of the two measurement axes 102, 104 should not remain constant. This requires that at least one of the first movable object 200 and the second movable object 300 will move during the measurements.

In an embodiment, both the first light frequency of the first light source 101 and the second light frequency of the second light source 107 may change during the measurements. For example, both the first light source 101 and the second light source 107 may be tunable lasers. In case both the first light frequency and the second light frequency are tuned, i.e. changed, during the measurements, it is advantageous that the first light source 101 and the second light source 107 have a large tuning range and/or that the tuning of the first light frequency and the second light frequency is opposite with respect to each other, for example 180° out-of-phase with respect to each other. This will provide measurement data that is more suitable for solving the non-linear equation.

In case both the first movable object 200 and the second movable object 300 are moved during the measurements, then it is desirable that the first movable object 200 and the second movable object 300 carry out different movements, for example movements in opposite directions.

Further, to simplify solving of the non-linear relationship, prior information can be used as input. For example, in case one of the first movable object 200 and the second movable object 300 does not move during the measurements, and one of the lights sources 101, 107 has a fixed light frequency, then the count offset associated with the respective measurements axis and light source from a previous solution can be stored and used as a boundary condition for solving the non-linear equation, in order to decrease the number of free estimators.

Further, when an average center frequency ratio between the first light frequency and the second light frequency of the first and second light sources 101, 107 is known for at least a certain averaging time period, this information can also be used to reduce the number of free estimators. This may reduce the complexity of the equation to be solved to a linear equation.

Prior count offset information that can be used to solve the non-linear equation may also be derived from a pre-calibrated measurement axis. These previously calibrated count offsets may for example be stored in a memory of the processing device 106 to be used later.

Once the first count offset $\text{offset}_{ma1,\ ls1}$ and the further first count offset $\text{offset}_{ma1,\ ls2}$ are known for the first measurement axis 102, the determination of the second count offset $\text{offset}_{ma2,\ ls1}$ and the further second offset $\text{offset}_{ma2,\ ls2}$ may be simplified to a linear equation with only 2 unknown parameters.

Since $\lambda_{ls2}(t)/\lambda_{ls1}(t)=C_{ma1,\ ls1}(t)/C_{ma2,\ ls2}(t)$ is known, the second count offset $\text{offset}_{ma2,\ ls1}$ and the further second offset $\text{offset}_{ma2,\ ls2}$ can be calculated from:

$$\lambda_{1s2}(t)/\lambda_{1s1}(t)=\lambda\text{ratio}(t)=(\Delta C_{ma2,1s1}(t)+\text{offset}_{ma2,1s1})/(\Delta C_{ma2,1s2}(t)+\text{offset}_{ma2,1s2}).$$

This can be written as a set of linear equations in matrix notation, where i is an index indicating multiple rows, with the two unknown variables $\text{offset}_{ma2,\ ls1}$ and $\text{offset}_{ma2,\ ls2}$:

$$H=[\lambda\text{ratio}(t_i)-1]$$

$$b=[\Delta C_{ma2,1s2}(t_i)-\lambda\text{ratio}(t_i)\cdot\Delta C_{ma2,1s1}(t_i)]$$

The second count offset $\text{offset}_{ma2,\ ls1}$ and the further second offset $\text{offset}_{ma2,\ ls2}$ are then solved by a minimum-least squares fit:

$$[\text{offset}_{ma2,1s1};\text{offset}_{ma2,1s2}]=(H^TH)^{-1}H^Tb;$$

This equation may be solved by a linear least-squares fit method, resulting in the zeroing count offsets of the second measurement axis 104 with second count offset $\text{offset}_{ma2,\ ls1}$ and the further second offset $\text{offset}_{ma2,\ ls2}$.

For this set of linear equations to be solvable, λratio(t) must contain at least 2 unique, i.e. different values. Typically, the measurement data to solve the equations will be redundant and contain hundreds or thousands of datapoints in order to improve the fitting accuracy and reduce the error sensitivity to measurement noise.

In the embodiment of FIG. 2, the interferometer system 100 comprises two measurement axes 102, 104. It is possible that an interferometer system comprises more than two measurement axes. In such an interferometer system, the third and further measurement axes may be used for adding redundancy to the absolute zeroing equation by optimizing the nonlinear count-offset problem for different combinations of interferometer axes either simultaneously or sequentially. Once λratio(t) can be derived, the above linear equation may be used to solve the count offset equation for any of the other axes.

With the method above, the absolute number of counts of a measurement axis 102, 104, can be determined for a certain wavelength on the basis of the count offset of the respective measurement axis 102, 104. This means that the measurement is regarded to be "traceable" to the wavelength of the respective light source 101, 107. Basically this count offset is the parameter of interest for determining the absolute position that can be measured by the interferometer system 100.

However, in order to be able to determine the absolute position in meters at a certain point in time either the wavelength of at least one of the lights sources 101, 107 should be known or the length of at least one of the measurement axis should be known. If either one of these two parameters, wavelength of the first or second beam or length of the first or second measurement axis, is known in meters, then all other parameters can also be determined in meters.

The wavelength of the light sources may be made traceable with respect to the meter by using a measurement against a calibrated light source, e.g. a calibrated laser, such as a comb laser or another stabilized reference laser. In another embodiment, analysis of the transmission intensity through a gas with a known transmission spectrum, i.e. a gas reference cell or a spectrum analyser may be used to determine the wavelength with respect to the meter. Other possibilities include locking a laser frequency to a known laser gain curve, such as is implemented in a Zeeman-split frequency stabilized laser. Alternatively, at least one interferometer axis can comprise a pre-calibrated cavity length.

Once the absolute length, in meters, of one measurement axis 102, 104 is known and the length ratio between the two interferometer axes 102, 104 is known, then the length of the other measurement axis 104, 102 is traceable to the length of the first measurement axis 102, 104. When the interferometer system 100 comprises more than two measurement axes, the length of these additional measurement axes may also be determined when the length of one of the measurement axes is known and the length ratio between the interferometer axes is known. The length of one interferometer axis may be determined using a previous or external calibration, while the length ratio can be determined on the basis of the solution of the non-linear equation described hereinabove.

Figure 3:
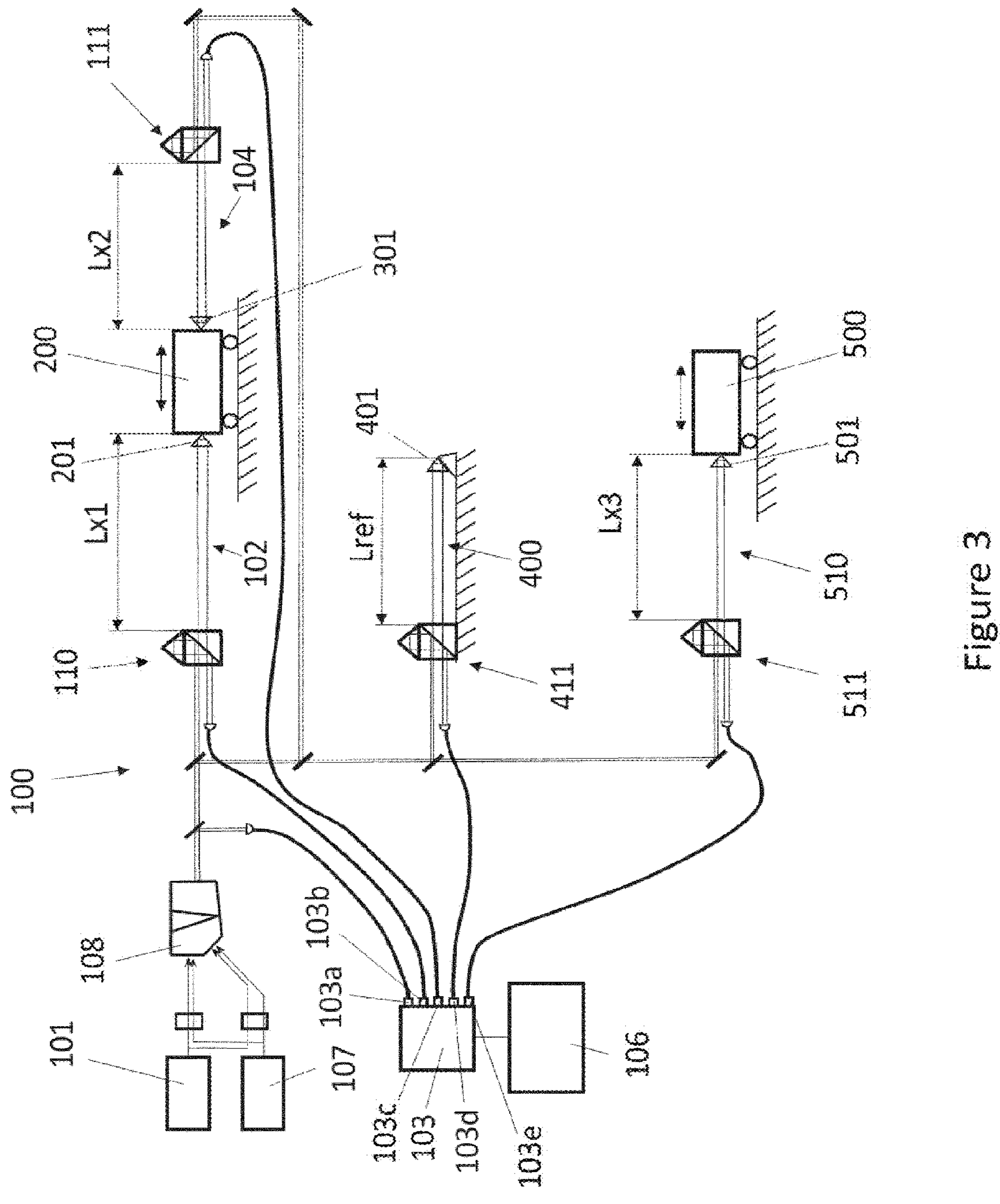
FIG. 3 shows a second embodiment of an interferometer system according to the invention.

FIG. 3 shows an embodiment of an interferometer system 100 having more than two measurement axes. The interferometer system of FIG. 3 comprises a stabilized first light source 101 and a second light source 107 with tunable light frequency. The tunable second light source 107 may have a relatively large tuning range to facilitate determination of length ratios between the different measurement axes.

Corresponding to the embodiment of FIG. 2, the interferometer system of FIG. 3 comprises a first measurement axis 102 and a second measurement axis 104. The first measurement axis 102 and the second measurement axis 104 are used to measure a position of a first movable object 200 using a first reflective measurement surface 201 and a second reflective measurement surface 301. The first reflective measurement surface 201 and the second reflective measurement surface 301 are arranged at opposite sides of the first movable object 200. When the first movable object 200 is moved in a direction such that the first measurement path length Lx1 increases, the second measurement path length Lx2 will decrease, and vice versa. The measurement data obtained by these opposite movements in the first measurement axis 102 and the second measurement axis 104 will improve the robustness of the non-linear algorithm. The movable object 200 may be movable over a relatively long stroke. Such movement over a relatively long stroke may facilitate accurate determination of the count offset of the respective measurement axis, in this case the first measurement axis 102 and the second measurement axis 104.

In addition to the first measurement axis 102 and the second measurement axis 104, the interferometer system 100 comprises a reference axis 400 and an additional measurement axis 510. The reference axis 400 is arranged to measure, using light of the first light source 101 and light of the second light source 107, via interferometer optics 411 a position, e.g. reference path length Lref, of a reference surface 401. The reference surface 401 is arranged at a fixed position. The reference interferometer signal related to the light of the first light source 101 and the further reference interferometer signal related to the light of the second light source 107, obtained from measurements on the reference axis 400 are guided to the detector **103*d* for further processing in the processing device 106. This reference axis 400 in combination with the first light source 101 with stabilized light frequency can be used to memorize the count offset of the reference axis 400. The memorized count offset can be used to facilitate solving the non-linear equation to determine the count offsets of the measurement axes, such as the first measurement axis 102, the second measurement axis 104 and the additional measurement axis 510**.

The additional measurement axis 510 is provided to determine a position, e.g. additional measurement path length Lx3, of an additional movable object 500. To measure this position, light of the first light source 101 and light of the second light source 107 is guided, via interferometer optics 511, to an additional reflective measurement surface 501 arranged on the additional movable object 500. The additional interferometer signal related to the light of the first light source 101 and the additional reference interferometer signal related to the light of the second light source 107, obtained from measurements on the additional measurement axis 510 are guided to the detector **103*e* for further processing in the processing device 106**.

If the additional movable object 500 is movable over a relative small stroke, such as for example a mirror of a projection system, the measurement data obtained from the additional measurement axis 510 may be less suitable to solve the non-linear equation. But since both the first movable object 200 and the additional movable object 500 are arranged within the same interferometer system 100 using the same light sources 101, 107 for measurements in the first measurement axis 102, the second measurement axis 104, the reference axis 400 and the additional measurement axis 510, the non-linear equation may be solved with mainly data of the measurements on the first measurement axis 102, the second measurement axis 104 and/or the reference axis 400. Once the count offset(s) of at least one of the first measurement axis 102 and the second measurements axis 104 have been determined, the count offset(s) for the additional measurement axis 510 may also be determined by the linear equations discussed hereinabove.

The interferometer system 100 may comprise more additional measurement axes to measure the position of more movable objects within for example a lithographic apparatus.

Embodiments of interferometer systems are described in which some optical paths are defined in free space and some are defined by optical fibers. In alternative embodiments, optical paths in free space may also be provided by optical fibers, and optical paths defined by optical fibers may be provided in free space.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus, it will be apparent to one skilled in the art that modifications may be made to the invention as described without departing from the scope of the claims set out below. Other aspects of the invention are set-out as in the following numbered clauses.

1. A method to determine an absolute position of a first movable object using an interferometer system, said method comprising:

providing a first beam and a second beam with a first light frequency from a first light source;

providing a further first beam and a further second beam with a second light frequency from a second light source, wherein the second light frequency is a tunable light frequency;

guiding the first beam and the further first beam along a first measurement axis to a first reflective surface of the first movable object to obtain a first interferometer signal and a further first interferometer signal, respectively, guiding the second beam and the further second beam along a second measurement axis to a second reflective surface of a second object to obtain a second interferometer signal and a further second interferometer signal, respectively, while changing the tunable light frequency of the second light source, detecting at at least one first detector the first interferometer signal and the further first interferometer signal, detecting at at least one second detector the second interferometer signal and the further second interferometer signal, determining on the basis of the first interferometer signal, the further first interferometer signal, the second interferometer signal and the further second interferometer signal a first count offset and/or a further first count offset using a non-linear equation, wherein the non-linear equation is based on the relationship:

$$\lambda_{1s2}/\lambda_{1s1} = C_{ma1,1s1}/C_{ma1,1s2} = C_{ma2,1s1}/C_{ma2,1s2},$$

wherein $\lambda_{ls2}$ is the second wavelength of the second light source, $\lambda_{ls1}$ is the first wavelength of the first light source, $C_{ma1,\ ls1}$ is a total number of counts with respect to the first measurement axis and the first beam, $C_{ma2,\ ls2}$ is a total number of counts with respect to the first measurement axis and the further first beam, $C_{ma2,\ ls1}$ is a total number of counts with respect to the second measurement axis and the second beam, $C_{ma2,\ ls2}$ is a total number of counts with respect to the second measurement axis and the further second beam, and determining the absolute position of the first movable object on the basis of the first count offset and the first interferometer signal and/or on the basis of the further first count offset and the further first interferometer signal.

2. The method of clause 1, wherein the step of determining the first count offset and/or the further first count offset comprises solving the non-linear equation:

$$\left(\Delta C_{ma1,ls2}(t) + offset_{ma1,ls2}\right) * \left(\Delta C_{ma2,ls1}(t) + offset_{ma2,ls1}\right) = \left(\Delta C_{ma2,ls2}(t) + offset_{ma2,ls2}\right) * \left(\Delta C_{ma1,ls1}(t) + offset_{ma1,ls1}\right)$$

wherein:

$\Delta C_{ma2,\ ls2}(t)$ is a change in counts over time with respect to the first measurement axis and the further first beam measured with the further first interferometer signal, $offset_{ma1,\ ls2}$ is the further first count offset with respect to the first measurement axis and the further first beam, $\Delta C_{ma2,\ ls1}(t)$ is a change in counts over time with respect to the second measurement axis and the second beam measured with the second interferometer signal, $offset_{ma2,\ ls1}$ is a second count offset with respect to the second measurement axis and the second beam, $\Delta C_{ma2,\ ls2}(t)$ is a change in counts over time with respect to the second measurement axis and the further second beam measured with the further second interferometer signal, $offset_{ma2,\ ls2}$ is a further second count offset with respect to the second measurement axis and the further second beam, $\Delta C_{ma1,\ ls1}(t)$ is a change in counts over time with respect to the first measurement axis and the first beam measured with the first interferometer signal, and $offset_{ma1,\ ls1}$ is the first count offset with respect to the first measurement axis and the first beam.

3. The method of clause 1 or 2, wherein the absolute position of the first movable object, L1, can be calculated as:

$$L1(t)=\lambda_{ls1}(t)*(\Delta C_{ma1,ls1}(t)+offset_{ma1,ls1}),\text{ or}$$

$$L1(t)=\lambda_{ls2}(t)*(\Delta C_{ma1,ls2}(t)+offset_{ma1,ls2}).$$

4. The method of any of the preceding clauses, wherein solving the non-linear equation comprises obtaining a first estimate using a reduced dataset and using the first estimate as input for solving the non-linear equation for a complete dataset.

5. The method of any of the preceding clauses, wherein the second object is movable.

6. The method of clause 5, wherein the method comprises determining an absolute position of the second object, comprising determining a second count offset and/or a further second count offset, and determining the absolute position of the second movable object on the basis of the second count offset and the second interferometer signal and/or on the basis of the further second count offset and the further second interferometer signal.

7. The method of clause 6, wherein the second count offset and/or the further second count offset are determined as:

$$(\Delta C_{ma2,ls1}(t)+offset_{ma2,ls1})/(\Delta C_{ma2,ls2}(t)+offset_{ma2,ls2})=\lambda_{ls2}/\lambda_{ls1}$$

wherein $\lambda_{ls2}/\lambda_{ls1}$ is known from the calculations with respect to the first measurement axis, $\Delta C_{ma2,\ ls1}(t)$ can be determined from the second interferometer signal, and $\Delta C_{ma2,\ ls2}(t)$ can be determined from the further second interferometer signal.

8. The method of clause 7, wherein the absolute position of the second movable object, L2, can be calculated as:

$$L2(t)=\lambda_{ls1}(t)*(\Delta C_{ma2,ls1}(t)+offset_{ma2,ls1}),\text{ or}$$

$$L2(t)=\lambda_{ls2}(t)*(\Delta C_{ma2,ls2}(t)+offset_{ma2,ls2}).$$

9. The method of any of the clauses 5-8, wherein the method comprises moving the first movable object in a first direction and moving the second object in a second direction, wherein the first direction and the second direction are opposite to each other.

10. The method of any of the preceding clauses, wherein the first light frequency is a tunable light frequency.

11. The method of clause 10, wherein tuning of frequencies of the first light frequency and the second light frequency is performed in opposite directions.

12. The method of any of the preceding clauses, wherein:

guiding the first beam along the first measurement axis comprises splitting the first beam into a first measurement beam and a first reference beam, wherein the first measurement beam is guided along a first measurement path to the first reflective measurement surface, and, after the first measurement beam is reflected by the first reflective measurement surface, the first measurement beam is recombined with the first reference beam to form the first interferometer signal, guiding the further first beam along the first measurement axis comprises splitting the further first beam into a further first measurement beam and a further first reference beam, wherein the further first measurement beam is guided along the first measurement path to the first reflective measurement surface, and, after the further first measurement beam is reflected by the first reflective measurement surface, the further first measurement beam is recombined with the further first reference beam to form the further first interferometer signal, guiding the second beam along the second measurement axis comprises splitting the second beam into a second measurement beam and a second reference beam, wherein the second measurement beam is guided along a second measurement path to the second reflective measurement surface, and, after the second measurement beam is reflected by the second reflective measurement surface, the second measurement beam is recombined with the second reference beam to form the second interferometer signal, and guiding the further second beam along the second measurement axis comprises splitting the further second beam into a further second measurement beam and a further second reference beam, wherein the further second measurement beam is guided along the second measurement path to the second reflective measurement surface, and, after the further second measurement beam is reflected by the second reflective measurement surface, the further second measurement beam is recombined with the further second reference beam to form the further second interferometer signal.

13. An interferometer system to determine an absolute position of a first movable object, said interferometer system comprising:

a first light source arranged to provide a first beam and a second beam with a first light frequency;

a second light source arranged to provide a further first beam and a further second beam with a second light frequency, wherein the second light source is arranged to provide a tunable second light frequency, a first measurement axis for guiding the first beam and the further first beam to a first reflective surface of the first movable object to obtain a first interferometer signal and a further first interferometer signal, respectively, a second measurement axis for guiding the second beam and the further second beam to a second reflective surface of a second object to obtain a second interferometer signal and a further second interferometer signal, respectively, at least one first detector to detect the first interferometer signal and the further first interferometer signal, at least one second detector to detect the second interferometer signal and the further second interferometer signal, a processing device, wherein the processing device is arranged to determine on the basis of the first interferometer signal, the further first interferometer signal, the second interferometer signal and the further second interferometer signal a first count offset and/or a further first count offset using a non-linear equation, wherein the non-linear equation is based on the relationship:

$$\lambda_{ls2}/\lambda_{ls1} = C_{ma1,ls1}/C_{ma1,ls2} = C_{ma2,ls1}/C_{ma2,ls2},$$

wherein $\lambda_{ls2}$ is the second wavelength of the second light source, $\lambda_{ls1}$ is the first wavelength of the first light source, $C_{ma1,\ ls1}$ is a total number of counts with respect to the first measurement axis and the first beam, $C_{ma2,\ ls2}$ is a total number of counts with respect to the first measurement axis and the further first beam, $C_{ma2,\ ls1}$ is a total number of counts with respect to the second measurement axis and the second beam, $C_{ma2,\ ls2}$ is a total number of counts with respect to the second measurement axis and the further second beam, and wherein the processing device is arranged to determine the absolute position of the first movable object on the basis of the first count offset and the first interferometer signal or on the basis of the further first count offset and the further first interferometer signal.

14. The interferometer system of clause 13, wherein the processing device is arranged to determine the first count offset and/or the further first count offset comprises solving the non-linear equation:

$$(\Delta C_{ma1,ls2}(t) + offset_{ma1,ls2}) * (\Delta C_{ma2,ls1}(t) + offset_{ma2,ls1}) = (\Delta C_{ma2,ls2}(t) + offset_{ma2,ls2}) * (\Delta C_{ma1,ls1}(t) + offset_{ma1,ls1})$$

wherein:

$\Delta C_{ma1,\ ls2}(t)$ is a change in counts over time with respect to the first measurement axis and the further first beam measured with the further first interferometer signal, $offset_{ma1,\ ls2}$ is the further first count offset with respect to the first measurement axis and the further first beam, $\Delta C_{ma2,\ ls1}(t)$ is a change in counts over time with respect to the second measurement axis and the second beam measured with the second interferometer signal, $offset_{ma2,\ ls1}$ is a second count offset with respect to the second measurement axis and the second beam, $\Delta C_{ma2,\ ls2}(t)$ is a change in counts over time with respect to the second measurement axis and the further second beam measured with the further second interferometer signal, $offset_{ma2,\ ls2}$ is a further second count offset with respect to the second measurement axis and the further second beam, $\Delta C_{ma1,\ ls1}(t)$ is a change in counts over time with respect to the first measurement axis and the first beam measured with the first interferometer signal, and $offset_{ma1,\ ls1}$ is the first count offset with respect to the first measurement axis and the first beam.

15. The interferometer system of clause 13 or 14, wherein the processing device is arranged to calculate the absolute position of the first movable object, L1, as:

$$L1(t) = \lambda_{ls1}(t) * (\Delta C_{ma1,ls1}(t) + offset_{ma1,ls1}),\ \text{or}$$

$$L1(t) = \lambda_{ls2}(t) * (\Delta C_{ma1,ls2}(t) + offset_{ma1,ls2}).$$

16. The interferometer system of any of the clauses 13-15, wherein solving the non-linear equation comprises obtaining a first estimate of the solution using a reduced dataset and using the first estimate as input for solving the non-linear equation for a complete dataset.

17. The interferometer system of any of the clauses 13-16, wherein the second object is movable.

18. The interferometer system of clause 17, wherein the processing device is arranged to determine an absolute position of the second object, comprising determining a second count offset and/or a further second count offset, and determining the absolute position of the second movable object on the basis of the second count offset and the second interferometer signal or on the basis of the further second count offset and the further second interferometer signal.

19. The interferometer system of clause 18, wherein the second count offset and/or the further second count offset are determined as:

$$(\Delta C_{ma2,ls1}(t) + offset_{ma2,ls1})/(\Delta C_{ma2,ls2}(t) + offset_{ma2,ls2}) = \lambda_{ls2}(t)/\lambda_{ls1}(t),$$

wherein $\lambda_{ls2}(t)/\lambda_{ls1}(t)$ is known from the calculations with respect to the first measurement axis, $\Delta C_{ma2,\ ls1}(t)$ can be determined from the second interferometer signal, and $\Delta C_{ma2,\ ls2}(t)$ can be determined from the further second interferometer signal.

20. The interferometer system of clause 19, wherein the absolute position of the second movable object, L2, can be calculated as:

$$L2(t) = \lambda_{ls1}(t) * (\Delta C_{ma2,ls1}(t) + offset_{ma2,ls1}),\ \text{or}$$

$$L2(t) = \lambda_{ls2}(t) * (\Delta C_{ma2,ls2}(t) + offset_{ma2,ls2}).$$

21. The interferometer system of any of the clauses 17-20, wherein the method comprises moving the first movable object in a first direction and moving the second object in a second direction, wherein the first direction and the second direction are opposite to each other.

22. The interferometer system of any of the clauses 13-21, wherein the first light frequency is a tunable light frequency.

23. The interferometer system of clause 22, wherein tuning of frequencies of the first light frequency and the second light frequency is performed in opposite directions.

24. The interferometer system of any of the clauses 13-23, wherein:

the first measurement axis is arranged to split the first beam into a first measurement beam and a first reference beam, to guide the first measurement beam along a first measurement path to the first reflective measurement surface, and to recombine, after the first measurement beam is reflected by the first reflective measurement surface, the first measurement beam with the first reference beam to form the first interferometer signal, the first measurement axis is arranged to split the further first beam into a further first measurement beam and a further first reference beam, to guide the further first measurement beam along the first measurement path to the first reflective measurement surface, and to recombine, after the further first measurement beam is reflected by the first reflective measurement surface, the further first measurement beam with the further first reference beam to form the further first interferometer signal, the second measurement axis is arranged to split the second beam into a second measurement beam and a second reference beam, to guide the second measurement beam along a second measurement path to the second reflective measurement surface, and to recombine, after the second measurement beam is reflected by the second reflective measurement surface, the second measurement beam with the second reference beam to form the second interferometer signal, and the second measurement axis is arranged to split the further second beam into a further second measurement beam and a further second reference beam, to guide the further second measurement beam along the second measurement path to the second reflective measurement surface, and to recombine, after the further second measurement beam is reflected by the second reflective measurement surface, the further second measurement beam with the further second reference beam to form the further second interferometer signal.

25. A projection system for optical lithography systems comprising the interferometer system of any of the clauses 13-24.

26. A lithographic apparatus, comprising the interferometer system of any of the clauses 13-24.

27. The lithographic apparatus of clause 26, wherein the first movable object is part of a projection system of the lithographic apparatus.

The invention claimed is:

1. A method to determine an absolute position of a first movable object using an interferometer system, said method comprising:

providing a first beam and a second beam with a first light frequency from a first light source;

providing a further first beam and a further second beam with a second light frequency from a second light source, wherein the second light frequency is a tunable light frequency;

guiding the first beam and the further first beam along a first measurement axis to a first reflective surface of the first movable object to obtain a first interferometer signal and a further first interferometer signal, respectively, guiding the second beam and the further second beam along a second measurement axis to a second reflective surface of a second object to obtain a second interferometer signal and a further second interferometer signal, respectively, while changing the tunable light frequency of the second light source, detecting, at at least one first detector, the first interferometer signal and the further first interferometer signal, detecting, at at least one second detector, the second interferometer signal and the further second interferometer signal, determining on the basis of the first interferometer signal, the further first interferometer signal, the second interferometer signal and the further second interferometer signal a first count offset and/or a further first count offset using a non-linear equation, wherein the non-linear equation is based on the relationship:

$$\lambda_{ls2}/\lambda_{ls1} = C_{ma1,ls1}/C_{ma1,ls2} = C_{ma2,ls1}/C_{ma2,ls2},$$

wherein $\Delta_{ls2}$ is the second wavelength of the second light source, $\Delta_{ls1}$ is the first wavelength of the first light source, $C_{ma1,\ ls1}$ is a total number of counts with respect to the first measurement axis and the first beam, $C_{ma1,\ ls2}$ is a total number of counts with respect to the first measurement axis and the further first beam, $C_{ma2,\ ls1}$ is a total number of counts with respect to the second measurement axis and the second beam, $C_{ma2,\ ls2}$ is a total number of counts with respect to the second measurement axis and the further second beam; and determining the absolute position of the first movable object on the basis of the first count offset and the first interferometer signal and/or on the basis of the further first count offset and the further first interferometer signal.

2. The method of claim 1, wherein the step of determining the first count offset and/or the further first count offset comprises solving the non-linear equation:

$$(\Delta C_{ma1,ls2}(t) + offset_{ma1,ls2}) * (\Delta C_{ma2,ls1}(t) + offset_{ma2,ls1}) = (\Delta C_{ma2,ls2}(t) + offset_{ma2,ls2}) * (\Delta C_{ma1,ls1}(t) + offset_{ma1,ls1})$$

wherein:

$\Delta C_{ma1,\ ls2}(t)$ is a change in counts over time with respect to the first measurement axis and the further first beam measured with the further first interferometer signal, $offset_{ma1,\ ls2}$ is the further first count offset with respect to the first measurement axis and the further first beam, $\Delta C_{ma2,\ ls1}(t)$ is a change in counts over time with respect to the second measurement axis and the second beam measured with the second interferometer signal, $offset_{ma2,\ ls1}$ is a second count offset with respect to the second measurement axis and the second beam, $\Delta C_{ma2,\ ls2}(t)$ is a change in counts over time with respect to the second measurement axis and the further second beam measured with the further second interferometer signal, $offset_{ma2,\ ls2}$ is a further second count offset with respect to the second measurement axis and the further second beam, $\Delta C_{ma1,\ ls1}(t)$ is a change in counts over time with respect to the first measurement axis and the first beam measured with the first interferometer signal, and $offset_{ma1,\ ls1}$ is the first count offset with respect to the first measurement axis and the first beam.

3. The method of claim 1, wherein the absolute position of the first movable object, L1, can be calculated as:

$$L1(t) = \lambda_{ls1}(t) * (\Delta C_{ma1,ls1}(t) + offset_{ma1,ls1}), \text{ or}$$

$$L1(t) = \lambda_{ls2}(t) * (\Delta C_{ma1,ls2}(t) + offset_{ma1,ls2}).$$

4. The method of claim 1, wherein solving the non-linear equation comprises obtaining a first estimate using a reduced dataset and using the first estimate as input for solving the non-linear equation for a complete dataset.

5. The method of claim 1, wherein the second object is movable.

6. The method of claim 5, wherein the method comprises determining an absolute position of the second object, comprising:

determining a second count offset and/or a further second count offset, and determining the absolute position of the second movable object on the basis of the second count offset and the second interferometer signal and/or on the basis of the further second count offset and the further second interferometer signal.

7. The method of claim 5, wherein the method comprises moving the first movable object in a first direction and moving the second object in a second direction, wherein the first direction and the second direction are opposite to each other.

8. The method of claim 1, wherein the first light frequency is a tunable light frequency.

9. The method of claim 8, wherein tuning of frequencies of the first light frequency and the second light frequency is performed in opposite directions.

10. An interferometer system to determine an absolute position of a first movable object, said interferometer system comprising:

a first light source arranged to provide a first beam and a second beam with a first light frequency;

a second light source arranged to provide a further first beam and a further second beam with a second light frequency, wherein the second light source is arranged to provide a tunable second light frequency, a first measurement axis for guiding the first beam and the further first beam to a first reflective surface of the first movable object to obtain a first interferometer signal and a further first interferometer signal, respectively, a second measurement axis for guiding the second beam and the further second beam to a second reflective surface of a second object to obtain a second interferometer signal and a further second interferometer signal, respectively, at least one first detector to detect the first interferometer signal and the further first interferometer signal, at least one second detector to detect the second interferometer signal and the further second interferometer signal, a processing device, wherein the processing device is arranged to determine on the basis of the first interferometer signal, the further first interferometer signal, the second interferometer signal and the further second interferometer signal a first count offset and/or a further first count offset using a non-linear equation, wherein the non-linear equation is based on the relationship:

$$\lambda_{ls2}/\lambda_{ls1} = C_{ma1,ls1}/C_{ma1,ls2} = C_{ma2,ls1}/C_{ma2,ls2},$$

wherein $\Delta_{ls2}$ is the second wavelength of the second light source, $\Delta_{ls1}$ is the first wavelength of the first light source, $C_{ma1,\ ls1}$ is a total number of counts with respect to the first measurement axis and the first beam, $C_{ma1,\ ls2}$ is a total number of counts with respect to the first measurement axis and the further first beam, $C_{ma2,\ ls1}$ is a total number of counts with respect to the second measurement axis and the second beam, $C_{ma2,\ ls2}$ is a total number of counts with respect to the second measurement axis and the further second beam; and wherein the processing device is arranged to determine the absolute position of the first movable object on the basis of the first count offset and the first interferometer signal or on the basis of the further first count offset and the further first interferometer signal.

11. The interferometer system of claim 10, wherein the processing device is arranged to determine the first count offset and/or the further first count offset comprises solving the non-linear equation:

$$(\Delta C_{ma1,ls2}(t) + offset_{ma1,ls2}) * (\Delta C_{ma2,ls1}(t) + offset_{ma2,ls1}) = (\Delta C_{ma2,ls2}(t) + offset_{ma2,ls2}) * (\Delta C_{ma1,ls1}(t) + offset_{ma1,ls1})$$

wherein:

$\Delta C_{ma1,\ ls2}(t)$ is a change in counts over time with respect to the first measurement axis and the further first beam measured with the further first interferometer signal, $offset_{ma1,\ ls2}$ is the further first count offset with respect to the first measurement axis and the further first beam, $\Delta C_{ma2,\ ls1}(t)$ is a change in counts over time with respect to the second measurement axis and the second beam measured with the second interferometer signal, $offset_{ma2,\ ls1}$ is a second count offset with respect to the second measurement axis and the second beam, $\Delta C_{ma2,\ ls2}(t)$ is a change in counts over time with respect to the second measurement axis and the further second beam measured with the further second interferometer signal, $offset_{ma2,\ ls2}$ is a further second count offset with respect to the second measurement axis and the further second beam, $\Delta C_{ma1,\ ls1}(t)$ is a change in counts over time with respect to the first measurement axis and the first beam measured with the first interferometer signal, and $offset_{ma1,\ ls1}$ is the first count offset with respect to the first measurement axis and the first beam.

12. The interferometer system of claim 10, wherein the processing device is arranged to calculate the absolute position of the first movable object, L1, as:

$$L1(t) = \lambda_{ls1}(t) * (\Delta C_{ma1,ls1}(t) + offset_{ma1,ls1}), \text{ or}$$

$$L1(t) = \lambda_{ls2}(t) * (\Delta C_{ma1,ls2}(t) + offset_{ma1,ls2}).$$

13. The interferometer system of any of the claim 10, wherein solving the non-linear equation comprises obtaining a first estimate of the solution using a reduced dataset and using the first estimate as input for solving the non-linear equation for a complete dataset.

14. The interferometer system of claim 10, wherein the second object is movable.

15. The interferometer system of claim 14, wherein the method comprises moving the first movable object in a first direction and moving the second object in a second direction, wherein the first direction and the second direction are opposite to each other.

16. The interferometer system of claim 10, wherein the first light frequency is a tunable light frequency.

17. The interferometer system of claim 16, wherein tuning of frequencies of the first light frequency and the second light frequency is performed in opposite directions.

18. A projection system for optical lithography systems comprising the interferometer system of claim 10.

19. A lithographic apparatus, comprising the interferometer system of claim 10.

20. The lithographic apparatus of claim 19, wherein the first movable object is part of a projection system of the lithographic apparatus.

* * * * *